US010580513B2

(12) United States Patent
Maeda et al.

(10) Patent No.: US 10,580,513 B2
(45) Date of Patent: Mar. 3, 2020

(54) SEMICONDUCTOR DEVICE AND DIAGNOSTIC METHOD THEREFOR

(71) Applicant: Renesas Electronics Corporation, Tokyo (JP)

(72) Inventors: Yoichi Maeda, Tokyo (JP); Hideshi Maeno, Tokyo (JP); Jun Matsushima, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 35 days.

(21) Appl. No.: 15/862,041

(22) Filed: Jan. 4, 2018

(65) Prior Publication Data
US 2018/0277237 A1  Sep. 27, 2018

(30) Foreign Application Priority Data
Mar. 21, 2017 (JP) ................... 2017-053974

(51) Int. Cl.
*G11C 29/42* (2006.01)
*G11C 29/38* (2006.01)
(Continued)

(52) U.S. Cl.
CPC ............ *G11C 29/42* (2013.01); *G06F 3/0604* (2013.01); *G06F 3/0632* (2013.01); *G06F 3/0688* (2013.01); *G11C 29/18* (2013.01); *G11C 29/20* (2013.01); *G11C 29/26* (2013.01); *G11C 29/32* (2013.01); *G11C 29/36* (2013.01); *G11C 29/38* (2013.01); *G11C 29/4401* (2013.01); *G11C 29/52* (2013.01); *G11C 2029/0401* (2013.01); *G11C 2029/0407* (2013.01); *G11C 2029/2602* (2013.01); *G11C 2029/3202* (2013.01); *G11C 2029/4402* (2013.01)

(58) Field of Classification Search
CPC ......... G11C 29/42; G11C 29/38; G11C 29/18; G11C 29/36
See application file for complete search history.

(56) References Cited

U.S. PATENT DOCUMENTS 4,461,001 A    7/1984  Bossen et al.
4,584,681 A *  4/1986  Singh ................. G11C 29/70
                                                714/6.32
(Continued)

FOREIGN PATENT DOCUMENTS

JP    2008-71490 A    3/2008

OTHER PUBLICATIONS

Communication dated Jul. 31, 2018, from the European Patent Office in counterpart European Application No. 18151650.1.

*Primary Examiner* — Joseph D Torres
(74) *Attorney, Agent, or Firm* — McDermott Will & Emery LLP

(57) ABSTRACT

An address generation circuit generates a target address to be tested in a memory. A test data generation circuit generates write data for the address and expected value data for read data from the address. A judgment circuit compares matching/non-matching of the read data and the expected value data, for each address, judges that error correction is possible when the number of non-matching bits is within a range of numbers of bits to be error-corrected by an ECC circuit, and judges that error correction is not possible when the number is not within the range.

10 Claims, 13 Drawing Sheets

(51) Int. Cl.
*G11C 29/18* (2006.01)
*G11C 29/36* (2006.01)
*G11C 29/20* (2006.01)
*G11C 29/52* (2006.01)
*G11C 29/44* (2006.01)
*G11C 29/32* (2006.01)
*G11C 29/26* (2006.01)
*G06F 3/06* (2006.01)
*G11C 29/04* (2006.01)

(56) References Cited

U.S. PATENT DOCUMENTS

| | | | |
|---|---|---|---|
| 5,173,906 A | 12/1992 | Dreibelbis et al. | |
| 5,383,195 A * | 1/1995 | Spence | G01R 31/31855 714/733 |
| 9,432,298 B1 * | 8/2016 | Smith | H04L 49/9057 |
| 9,984,766 B1 * | 5/2018 | Becker | G11C 29/16 |
| 2003/0204795 A1 * | 10/2003 | Adams | G11C 29/14 714/718 |
| 2003/0204798 A1 * | 10/2003 | Adams | G06F 11/1008 714/723 |
| 2004/0085821 A1 * | 5/2004 | Kim | G11C 29/76 365/200 |
| 2005/0007172 A1 | 1/2005 | Sadakata et al. | |
| 2005/0160332 A1 * | 7/2005 | Hirabayashi | G11C 29/42 714/718 |
| 2005/0219886 A1 * | 10/2005 | Marumoto | G11C 29/44 365/45 |
| 2005/0281112 A1 * | 12/2005 | Ito | G11C 11/406 365/222 |
| 2006/0048031 A1 | 3/2006 | Aadsen et al. | |
| 2007/0255981 A1 * | 11/2007 | Eto | G06F 11/1008 714/710 |
| 2007/0274142 A1 | 11/2007 | Nishikawa | |
| 2008/0072118 A1 * | 3/2008 | Brown | G11C 29/56 714/763 |
| 2010/0083037 A1 * | 4/2010 | Oberlaender | G11C 29/44 714/5.1 |
| 2010/0125765 A1 * | 5/2010 | Orbach | G06F 11/1048 714/718 |
| 2014/0143619 A1 * | 5/2014 | Gorman | G11C 29/36 714/719 |
| 2014/0146624 A1 | 5/2014 | Son et al. | |
| 2014/0372814 A1 * | 12/2014 | Oberlaender | G06F 11/1048 714/719 |
| 2015/0039952 A1 * | 2/2015 | Goessel | G06F 11/263 714/719 |
| 2016/0042809 A1 | 2/2016 | Kim et al. | |
| 2016/0283339 A1 | 9/2016 | Yamate et al. | |

* cited by examiner

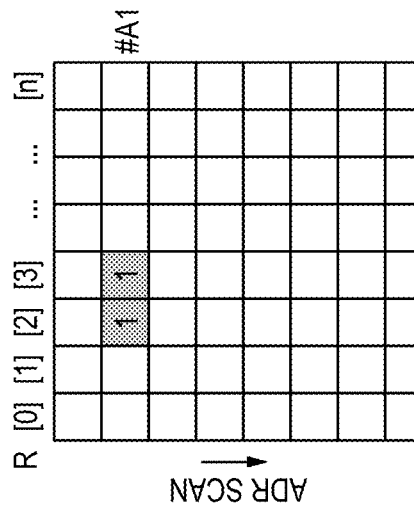
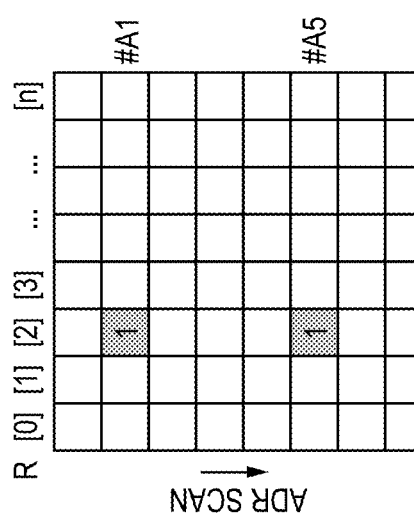
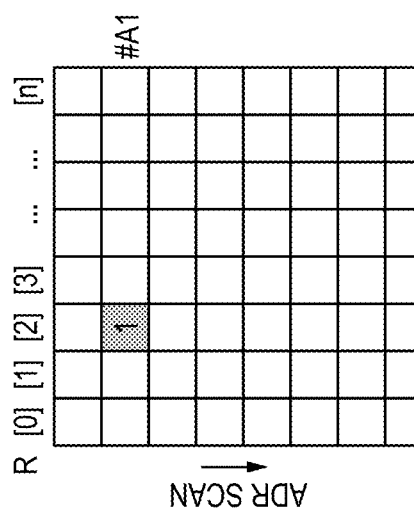

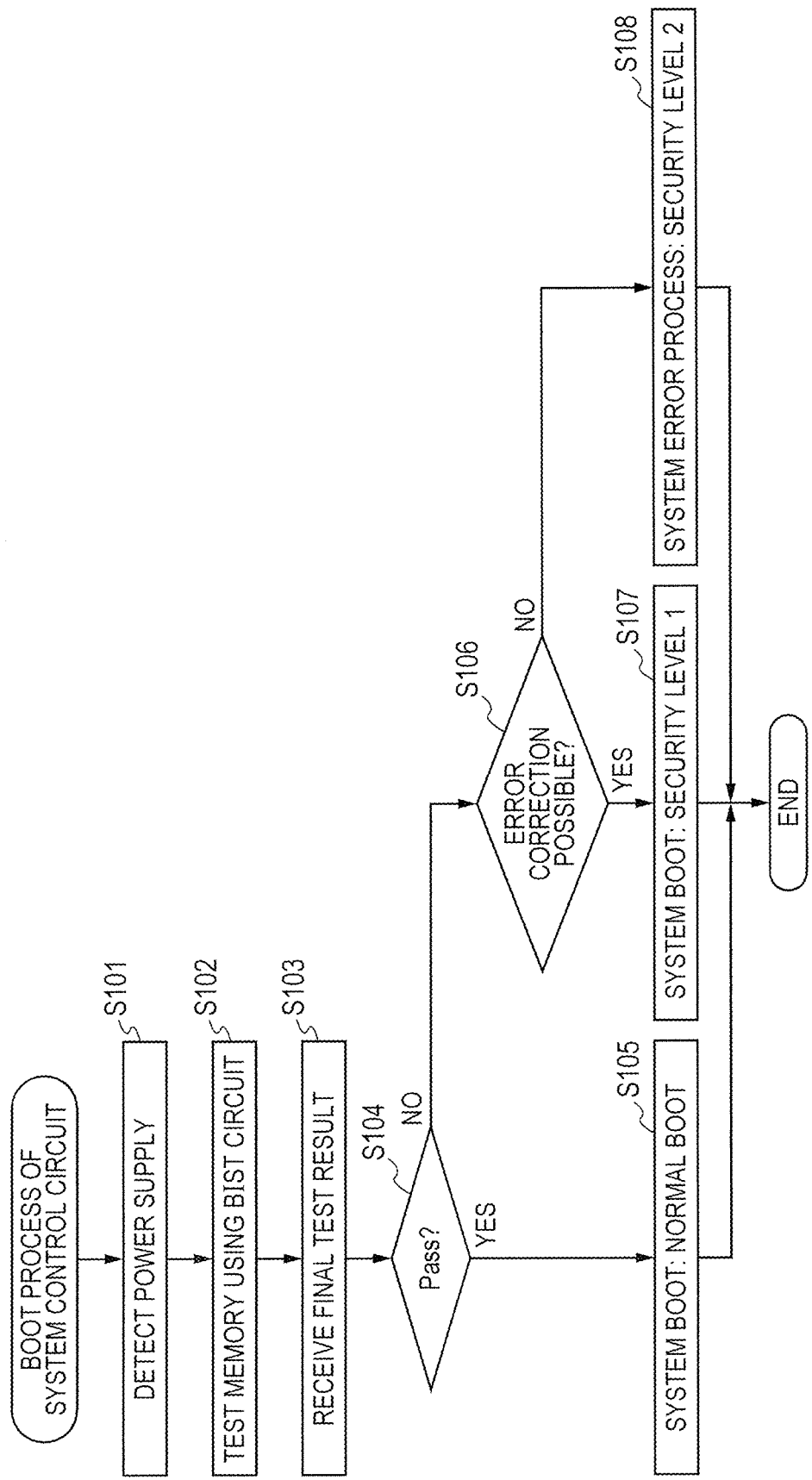

SEMICONDUCTOR DEVICE AND DIAGNOSTIC METHOD THEREFOR

CROSS-REFERENCE TO RELATED APPLICATIONS

The disclosure of Japanese Patent Application No. 2017-053974 filed on Mar. 21, 2017 including the specification, drawings and abstract is incorporated herein by reference in its entirety.

BACKGROUND

The present invention relates to a semiconductor device and a diagnostic method for the semiconductor device, and relates, for example, to a semiconductor device including a self-diagnosis function for a memory and a diagnostic method for the semiconductor device.

For example, U.S. Pat. No. 5,173,906 discloses a BIST (Built In Self Test) circuit for diagnosing a memory array. This BIST circuit includes an address counter and a data pattern generation circuit, for determining respectively an address and data to be input to a memory array, a state machine controlling them, a data compression circuit comparing read data from the memory array and an expected value and compressing the comparison result to 1 bit, and a fail address register storing its output.

SUMMARY

For example, in the field of automobiles, to correspond to ISO26262 as a functional safety standard, it is essential to mount an ECC (Error Correcting Code) circuit for a built-in memory of a semiconductor device and a BIST circuit. When an error meeting a particular condition has occurred in each memory cell, the ECC circuit corrects this error, thereby continuing an operation of the system without stoppage. On the other hand, the BIST circuit diagnoses whether there is an error in the memory cell on booting of the semiconductor device. When the BIST circuit detects an error, it issues failure notification to the system, and urges it to stop the operation.

It is assumed that the built-in memory of the semiconductor device has an error which can be corrected by the ECC circuit. In this case, because the error can be corrected by the ECC circuit, the system failure should not essentially occur. However, for example, when the BIST circuit disclosed in U.S. Pat. No. 5,173,906 is mounted, on booting of the system, an error of the semiconductor device (specifically, a built-in memory) is detected by the BIST circuit. As a result, failure notification is issued to the system. This is because the BIST circuit disclosed in U.S. Pat. No. 5,173,906 cannot easily discriminate whether error correction by the ECC circuit is possible. Thus, when the error is detected, failure notification is performed for the system regardless of the correction possibility.

Preferred embodiments as will be described below have been made in consideration of the above. Other problems and new features will be apparent from the descriptions of this specification and the accompanying drawings.

A semiconductor device according to an embodiment has a memory and a BIST circuit which diagnoses the memory. The BIST circuit has an address generation circuit, a test data generation circuit, and a judgment circuit. The address generation circuit generates a target address to be tested in the memory. The test data generation circuit generates write data for this address and expected value data for read data from the corresponding address. For each address, the judgment circuit compares matching/non-matching of the read data and the expected value data for each bit, judges that error correction is possible when the number of bits is within a range of numbers of bits to be error-corrected, and judges that error correction is not possible when the number is not within the range.

According to the embodiment, it is possible to judge whether error correction is possible using the ECC circuit, by the BIST circuit.

BRIEF DESCRIPTION OF THE DRAWINGS

FIGS. 4A, 4B, and 4C are pattern diagrams illustrating an operation example at the time of a test using the judgment circuit of FIG. 3A.

FIG. 5 is a flow diagram illustrating an example of process contents of the main part of a system control circuit in FIG. 1.

DESCRIPTIONS OF THE PREFERRED EMBODIMENTS

Figure 1:
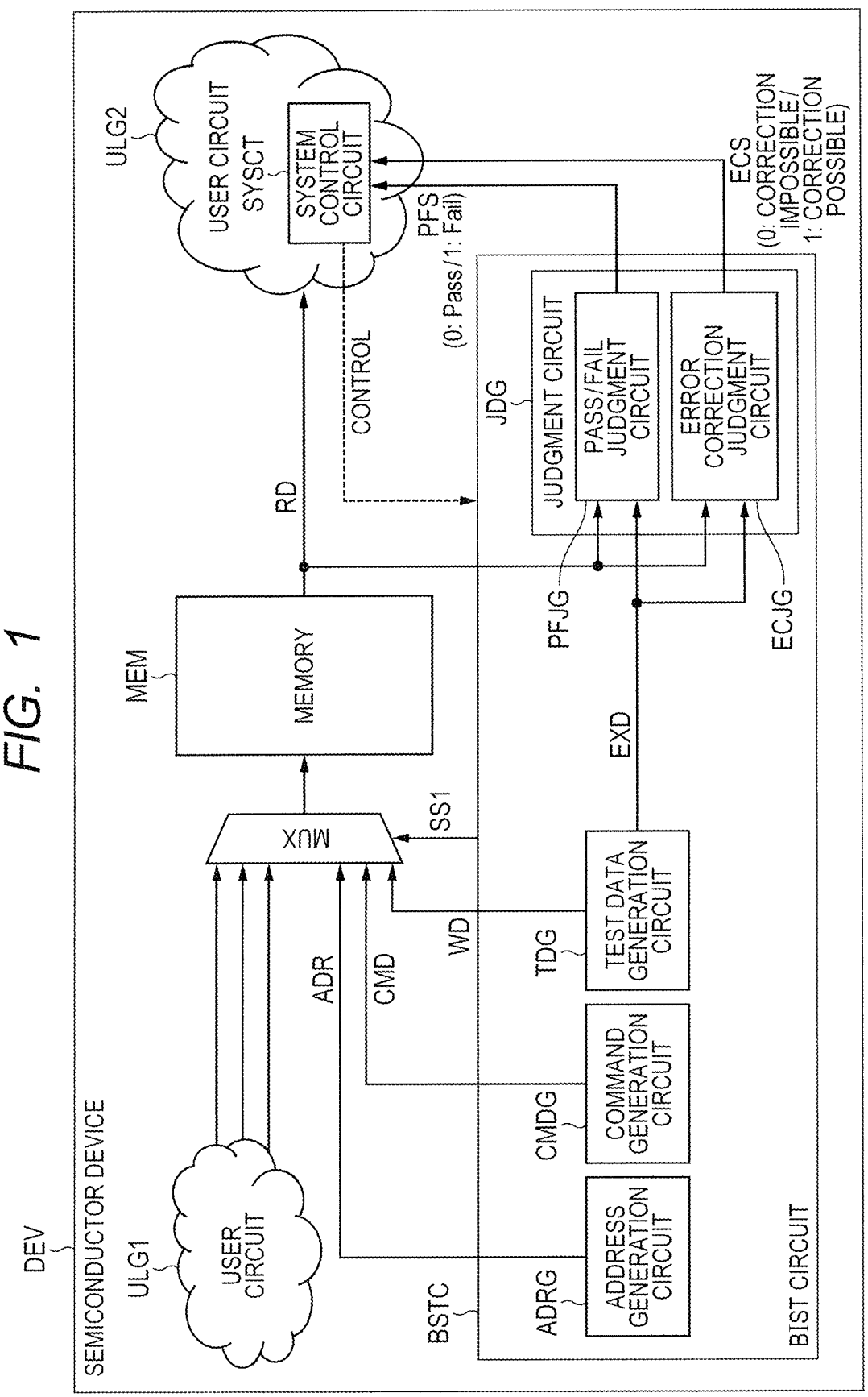
FIG. 1 is a schematic diagram illustrating a configuration example of the main part of a semiconductor device according to an embodiment 1 of the present invention.

In the following preferred embodiments, if necessary for convenience sake, descriptions will be made to divided plural sections or preferred embodiments, however, unless otherwise specified, they are not mutually irrelevant, but one is in relations of modifications, details, supplementary explanations of a part or whole of the other. In the following preferred embodiments, in the case of reference to the number of elements (including the quantity, numeric value, amount, range), unless otherwise specified and unless clearly limited in principle, the present invention is not limited to the specified number, and a number over or below the specified one may be used.

Further, in the following preferred embodiments, the constituent elements (including the element steps) are not necessarily indispensable, unless otherwise specified and unless considered that they are obviously required in principle. Similarly, in the following preferred embodiments, in the reference of the forms of the constituent elements or the positional relationships, they intend to include those approximating or similar substantially to the forms and like, unless otherwise specified and unless considered that they are obviously not required in principle. This is also true of the foregoing numerical values and the range.

Descriptions will now specifically be made to the preferred embodiments of the present invention based on the illustrations. In the drawings below for explaining the preferred embodiments, the same constituent elements are identified by the same reference symbols, and thus may not be described over and over as needed.

Embodiment 1

<<Schematic Configuration of Semiconductor Device>>

FIG. 1 is a schematic diagram illustrating a configuration example of the main part of a semiconductor device according to an embodiment 1 of the present invention. The semiconductor device DEV illustrated in FIG. 1 is configured with one semiconductor chip. Though no particular restriction is made, it is a micro controller chip. The semiconductor device DEV includes user circuits ULG1 and ULG2, a memory MEM, a BIST circuit BSTC, and a selection circuit MUX. Though no particular restriction is made, the memory MEM is, for example, an SRAM (Static Random Access Memory).

The user circuits ULG1 and ULG2 include, for example, a CPU (Central Processing Unit) and realize a desired function in accordance with the user. In the example of FIG. 1, for convenience sake of descriptions, the user circuit ULG1 performing a process on the input side of the memory MEM and the user circuit ULG2 performing a process on the output side of the memory MEM are separately described. However, the user circuits ULG1 and ULG2 may be physically the same circuits. In this specification, the user circuits ULG1 and ULG2 are collectively called a user circuit ULG. The user circuit ULG (in this example, ULG2) includes a system control circuit SYSCT which performs a boot time control of the semiconductor device DEV.

The BIST circuit BSTC includes an address generation circuit ADRG, a command generation circuit CMDG, a test data generation circuit TDG, and a judgment circuit JDG. The address generation circuit ADRG sequentially generates a target address ADR to be tested in the memory MEM. The command generation circuit CMDG generates commands CMD, such as a write command and a read command. The test data generation circuit TDG generates write data WD to the address ADR and expected value data EXD for read data RD from the address ADR. Specifically, the test data generation circuit TDG generates write data WD, when the command generation circuit CMDG issues a write command, and generates expected value data EXD, when the command generation circuit CMD issues a read command.

The selection circuit MUX selects an address, a command, and write data from the user circuit ULG or the address ADR, the command CMD, and the write data WD from the BIST circuit BSTC. Then, the circuit outputs them to the memory MEM. When, a test is performed, the BIST circuit BSTC controls a selection signal SS1, thereby controlling the selection circuit MUX to select each signal from the BIST circuit BSTC.

The judgment circuit JDG includes a pass/fail judgment circuit PFJG and an error correction judgment circuit ECJG. For each address ADR, the pass/fail judgment circuit PFJG compares matching/non-matching of the read data RD from the memory MEM and the expected value data EXD from the test data generation circuit TDG, in association with each bit. The pass/fail judgment circuit PFJG outputs a pass/fail judgment signal PFS at a level "0" representing non-existence of error (pass), when there is no non-matching bits (that is, an error) within target addresses ADR to be tested which are generated by the address generation circuit ADRG. The pass/fail judgment circuit PFJG outputs a pass/fail judgment signal PFS at a level "1" representing existence of error (fail), when there is non-matching bits within the target addresses ADR to be tested.

For each address ADR, the error correction judgment circuit ECJG compares matching/non-matching of the read data RD and the expected value data EXD, judges that error correction is possible when the number of non-matching bits is within a range of numbers of bits to be error-corrected by the ECC circuit, and judges that error correction is not possible when the number is not within the range. The error correction judgment circuit ECJG outputs a correction judgment signal ECS at a level "0" representing that error correction is not possible, at the occurrence of a case in which it is judged that error correction is not possible, within the target addresses ADR to be tested. The error correction judgment circuit ECJG outputs a correction judgment signal ECS at a level "1" representing that error correction is possible, at the non-occurrence of a case in which it is judged that error correction is not possible, and at the occurrence of a case in which it is judged that error correction is possible, within the target addresses ADR to be tested.

In this manner, the judgment circuit JDG discriminates between test results in association with each of the addresses into three cases. In the first case, it is judged as "pass" when the comparison results all coincide with each other in association with the bits (in this specification, this case is called "pass case"). In the second case, it is judged that error correction is possible (in this specification, this case is called "error correction possible case"). In the third case, it is judged that error correction is not possible (in this case, this case is called "error correction impossible case"). The judgment circuit JDG outputs either one of three signals corresponding respectively to the above three cases to the system control circuit SYSCT, as the final test result, in accordance with the occurrence state of three cases at the target addresses ADR to be tested.

Specifically, the judgment circuit JDG outputs a signal corresponding to the correction impossible case, as the final test result, at the occurrence of the correction impossible case at the target addresses ADR to be tested. This signal is a combination of a pass/fail judgment signal PFS at the level "1" (fail) and a correction judgment signal ECS at the level "0" (error correction impossible). When this signal is received, the system control circuit SYSCT recognizes that there are a memory failure and a system failure, due to occurrence of an error which cannot be corrected.

When there is no occurrence of the correction impossible case at the target addresses ADR to be tested, and when there is occurrence of the correction possible case, the judgment circuit JDG outputs a signal corresponding to the correction possible case, as the final test result. This signal is a combination of a pass/fail judgment signal PFS at the level "1" (fail) and a correction judgment signal ECS at the level "1" (error correction possible). When this signal is received, the system control circuit SYSCT recognizes that there is no memory failure and no system failure, due to occurrence of an error which can be corrected.

When only a pass case has occurred at the target addresses ADR to be tested, the judgment circuit JDG outputs a signal corresponding to the pass case, as the final test result. This signal is a pass/fail judgment signal at the level "0" (pass), and the correction judgment signal ECS may be at a "don't care" level. When this signal is received, the system control circuit SYSCT recognizes that there is no memory failure and no system failure.

Figure 2:
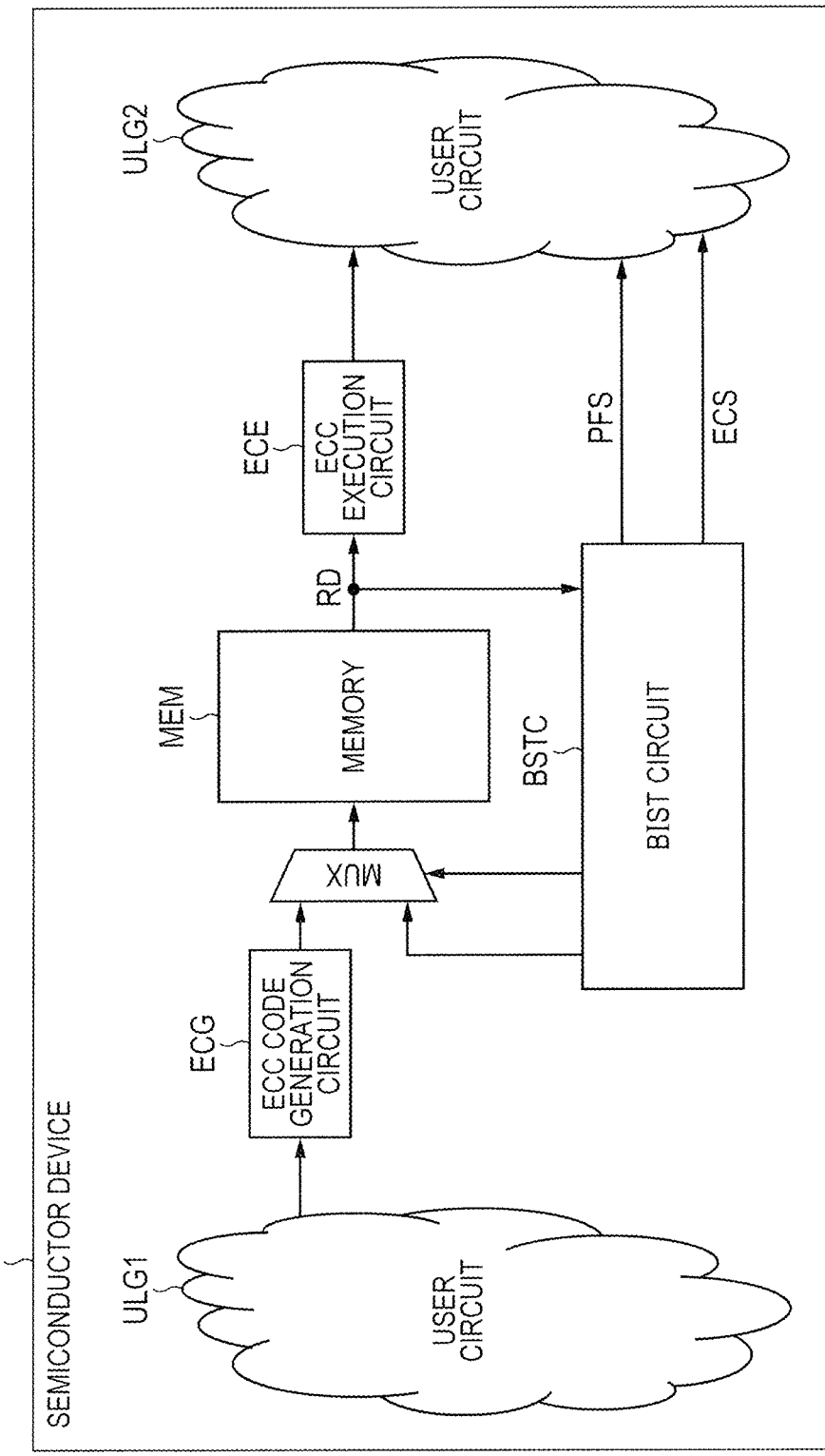
FIG. 2 is a schematic diagram illustrating an actual configuration example of the semiconductor device of FIG. 1.

FIG. 2 is a schematic diagram illustrating an actual configuration example of the semiconductor device of FIG. 1. In addition to the configuration example of FIG. 1, the semiconductor device DEV illustrated in FIG. 2 is configured with an ECC code generation circuit ECG and an ECC execution circuit ECE. The ECC code generation circuit ECG is provided between the user circuit ULG and the selection circuit MUX, and generates write data with an ECC coded affixed thereto at the time of a write operation for the memory MEM by the user circuit ULG. The ECC execution circuit ECE is provided between the memory MEM and the user circuit ULG, and executes error correction based on the ECC code at the time of a read operation for the memory MEM by the user circuit ULG.

When the user circuit ULG performs the write operation for the memory MEM, the ECC code generated by the ECC code generation circuit ECG is stored in the memory MEM, in addition to write data. When the user circuit ULG performs the read operation for the memory MEM, the ECC code is read from the memory MEM, in addition to the read data RD. The BIST circuit BSTC tests the memory MEM without particularly discriminating between a region for storing the write data and a region for storing the ECC code, without through the ECC circuit, inside this ECC circuit.

<<Details of Judgment Circuit>>

Figure 3B:
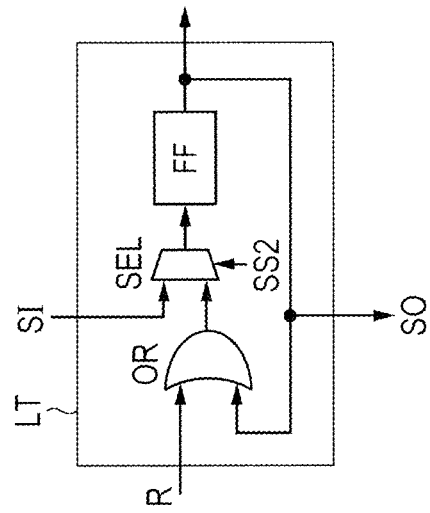
FIG. 3B is a circuitry diagram illustrating a configuration example of a latch circuit of FIG. 3A.
Figure 3A:
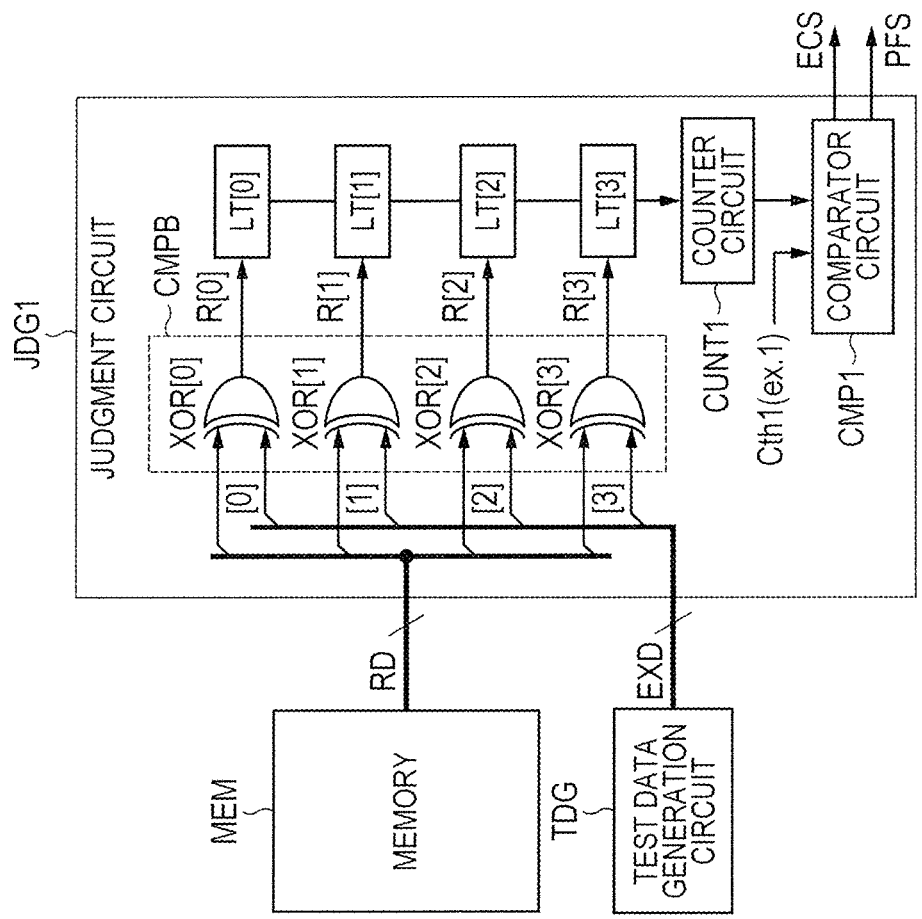
FIG. 3A is a circuitry diagram illustrating a configuration example of a judgment circuit in FIG. 1.

FIG. 3A is a circuitry diagram illustrating a configuration example of the judgment circuit of FIG. 1, and FIG. 3B is a circuitry diagram illustrating a configuration example of a latch circuit in FIG. 3A. FIG. 4A, FIG. 4B, and FIG. 4C are pattern diagrams illustrating an operation example at the time of a test using the judgment circuit of FIG. 3A. In FIG. 3A, read data RD from the memory MEM and expected value data EXD from the test data generation circuit TDG both include "n" bits (in this example, 4 bits, for the sake of simple descriptions).

A judgment circuit JDG1 illustrated in FIG. 3A includes a bit comparison circuit CMPB, latch circuits LT[0] to LT[3] of "n" bits (4 bits), a counter circuit CUNT1, and a count value comparison circuit CMP1. The bit comparison circuit CMPB compares matching/non-matching of four-bit read data RD[0] to RD[3] and four-bit expected value data EXD[0] to EXD[3], in association with each address (read address) ADR using the address generation circuit ADRG. The bit comparison circuit CMPB outputs four bit comparison result signals R[0] to R[3], in which each bit is at the level "0"/"1" in accordance with matching/non-matching of each corresponding bit.

In this example, the bit comparison circuit CMPB is configured with four exclusive OR gates XOR[0] to XOR[3] which compare the read data RD[0] to RD[3] and the expected value data EXD[0] to EXD[3], in association with each bit. Note that the kind of logical gates may appropriately be changed, for example, by using negative logics. This change of the kind of the OR gates may similarly be performed in the configuration example as will be described later.

The latch circuits LT[0] to LT[3] respectively latch the comparison result signals R[0] to R[3]. In this specification, the latch circuits LT[0] to LT[3] are collectively called a latch circuit LT, whereas the comparison result signals R[0] to R[3] are collectively called a comparison result signal R. The latch circuit LT includes, as illustrated in FIG. 3B, an OR gate OR, a selection circuit SEL, and a flip flop circuit FF. The OR gate OR performs an OR operation of the comparison result signal R and a holding signal of the flip flop circuit FF. The selection circuit SEL selects either one of an output signal from the OR gate OR and a scan-in signal SI, based on a selection signal SS2, and outputs it to the flip flop circuit FF.

Accordingly, the latch circuits LT[0] to LT[3] have scanning functions attached thereto, and are sequentially scanned for coupling. The holding signal of the flip flop circuit FF in the latch circuit LT is a scan-out signal SO and a scan-in signal SI of another latch circuit LT as a target to scan for coupling. For example, the scan-out signal SO of the latch circuit LT[0] is a scan-in signal SI of the latch circuit LT[1].

The counter circuit CUNT1 counts the number of bits that the level "1" (non-matching level) is latched from the four-bit latch circuits LT[0] to LT[3], using the scanning function, at the stage of ending the test. The count value comparison circuit CMP1 compares the count value of the counter circuit CUNT1 and a predetermined threshold value Cth1, thereby judging whether the number of non-matching bits is within a range of the number of bits to be error-corrected by the ECC circuit. In addition, the count value comparison circuit CMP1 judges whether "pass" or "fail". The count value comparison circuit CMP1 outputs a pass/fail judgment signal PFS and a correction judgment signal ECS, based on the judgment results.

As described above, when a level "1" (non-matching level) occurs in the comparison result signals R[0] to R[3], the judgment circuit JDG1 of FIG. 3A latches this level "1" using a corresponding latch signal LT. In the latch circuit LT, because the comparison result signal R is input to the flip flop circuit FF through the OR gate OR, the flip flop circuit FF once holds the level "1", and then keeps holding the level "1" until occurrence of reset or recovering.

Upon completion of the test corresponding to the target address ADR to be tested, the BIST circuit BSTC switches the selection signal SS2 to the side of the scan path, shifts sequentially the values of the flip flop circuits in the latch circuits LT[0] to LT[3] using the scan path, and at the same time outputs the values to the counter circuit CUNT1. The counter circuit CUNT1 counts up, if the input value is at the level "1". As a result, after the values of the flip flop circuits in the entire latch circuits LT[0] to LT[3] are input to the counter circuit CUNT1, the count value comparison circuit CMP1 can set the final test result based on the count values.

For example, when a threshold value (that is, the number of bits to be corrected) Cth1 is assumed as "1", the final test result shows that it is a case of "pass", if the count value of the counter circuit CUNT1 is "0", and it is a case of "fail" and that correction is possible, if the value is "1". In addition, it is a case of "fail" and that correction is not possible, if the value is "2" or greater. In accordance with this, the count value comparison circuit CMP1 outputs a pass/fail judgment signal PFS at the level "0", if the count value is "0", outputs a pass/fail judgment signal PFS at the level "1" and a correction judgment signal ECS at the level "1", if the value is "1", and outputs a pass/fail judgment signal PFS at the level "1" and a correction judgment signal ECS at the level "0", if the value is "2" or greater.

As a specific example of a test, in FIG. 4A, the comparison result signal R[2] is at the level "1" (non-matching level) in a read cycle for an address ADR # A1. In this case, at the completion of a test (address scan) for a target address ADR to be tested, the level "1" is held in the flip flop circuit FF in the latch circuit LT[2]. As a result, the count value of the counter circuit CUNT1 is "1", and the final test result shows a case of "fail" and that correction is possible. In FIG. 4B, the comparison result signal R[2] is at the level "1" (non-matching level) in a read cycle for addresses ADR # A1 and # A5. In this case also, the final test result shows a case of "fail" and that correction is possible.

In FIG. 4C, the comparison result signals R[2] and R[3] are both at the level "1" (non-matching level) in a read cycle for the address ADR # A1. In this case, at the completion of a test for the target address ADR to be tested, the level "1" is held in the flip flop circuit FF in the latch circuits LT[2] and LT[3]. As a result, the count value of the counter circuit CUNT1 is "2", the final test result shows a case of "fail" and that correction is not possible.

<<Operation of System Control Circuit>>

FIG. 5 is a flow diagram illustrating an example of process contents of the main part of the system control circuit in FIG. 1. After detection of power supply of the semiconductor device DEV (Step S101), the system control circuit SYSCT controls the BIST circuit BSTC to execute a test (boot time diagnosis) for the memory (Step S102). At the completion of the test for the memory, the system control circuit SYSCT receives the final test result from the BIST circuit BSTC (Step S103).

In Step S104, when the final test result shows "pass" (that is, when a pass/fail judgment signal PFS at the level "0" is received, the system control circuit SYSCT boots the system including the user circuit ULG (Step S105). In Step S104, when the final test result shows "fail" (that is, when a pass/fail judgment signal PFS at the level "1" is received), the system control circuit SYSCT judges whether error correction is possible (Step S106).

In Step S106, when error correction is possible (that is, when a correction judgment signal ECS at the level "1" is received), the system control circuit SYSCT boots the system including the user circuit ULG (Step S107). Because the error correction performance of the ECC circuit is made due to the error, it may not be strong enough to correct a new error (for example, a soft error). Thus, it is preferred that the system control circuit SYSCT issues, for example, a warning level 1 to the external of the device. When the warning level 1 is issued, for example, the semiconductor device DEV may be rebooted as needed. If it is not improved yet, system maintenance may be performed.

In Step S106, when error correction is not possible (that is, when a correction judgment signal ECS at the level "0" is received), the system control circuit SYSCT does not boot the system including the user circuit ULG (Step S108). In this case, the system control circuit SYSCT issues, for example, a warning level 2 to the external of the device, thereby urging it to perform a system error process. The system error process includes, for example, rebooting of the semiconductor device DEV or system maintenance.

<<Schematic Configuration of Semiconductor Device (Comparative Example)>>

Figure 13:
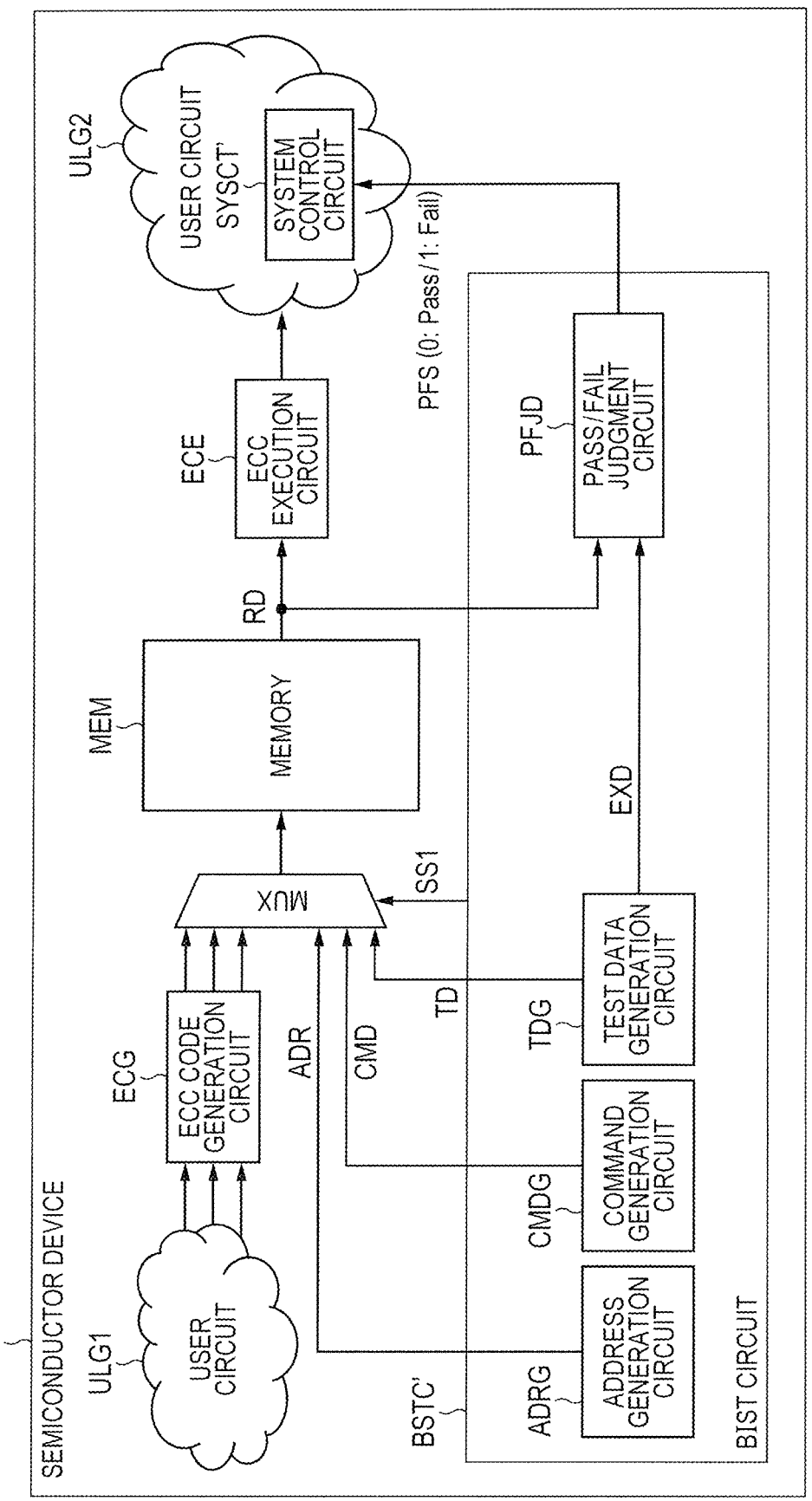
FIG. 13 is a schematic diagram illustrating a configuration example of the main part of a semiconductor device as a comparative example 1 of the present invention.

FIG. 13 is a schematic diagram illustrating a configuration example of the main part of a semiconductor device as a comparative example 1 of the present invention. Unlike the semiconductor device DEV illustrated in FIG. 1 and FIG. 2, a semiconductor device DEV' as the comparative example 1 illustrated in FIG. 13 is configured without the error correction judgment circuit ECJG in a BIST circuit BSTC'. Based only on the pass/fail judgment signal PFS, a system control circuit SYSCT' judges whether there is an error in the memory MEM, and further judges whether there is a system failure.

Particularly, when the memory MEM is an SRAM, it is known that a 1-bit error (called a soft error) randomly occurs due to a rays. Thus, in the SRAM, as its countermeasure, normally, an ECC circuit (ECG, ECE) illustrated in FIG. 13 and FIG. 2 is mounted. The soft error is generated also during BIST execution. Because the 1-bit error, such as a soft error, can substantially be corrected by the ECC execution circuit ECE, it is not assumed as a system failure, as seen externally from the system (the semiconductor device DEV). However, when a pass/fail judgment signal PFS at the level "1" (fail) is received from the BIST circuit BSTC', the system control circuit SYSCT' of FIG. 13 needs to judge that there is a system failure, regardless of whether error correction is possible.

As a comparative example 2, there is a system judging whether error correction is possible by the ECC circuit based on a diagnosis in accordance with a software process of the user circuit ULG, when an error is detected in the BIST circuit BSTC'. Particularly, when "fail" is received in Step S104 of FIG. 5, after the system control circuit SYSCT' boots the user circuit ULG, it controls the user circuit ULG to perform a test again. The user circuit ULG diagnoses the memory MEM, including the ECC circuit (ECG, ECE), based on whether reading/writing of the memory MEM have appropriately been performed from the outside of the ECC circuit (ECG, ECE). However, the diagnosis by this software process takes a long execution time, thereby undesirably causing an increase in the boot time of the semiconductor device DEV'.

As a comparative example 3, there is a system providing a BIST circuit to perform inputting/outputting from the outside of the ECC circuit (ECG, ECE). However, the BIST circuit may be used, for example, in a production test in manufacturing. In this case, in the nature of the production test, the BIST circuit is preferably provided inside the ECC circuit, as illustrated in FIG. 1. A logical address and logical data of a case in which the memory MEM is seen from the user circuit ULG and the ECC circuit may not coincide with a physical address and physical data of a case in which the memory MEM is seen alone. If a test is performed using the logical address and the logical data, a test reflecting the physical structure of the memory may not appropriately be performed.

<<Main Effect of Embodiment 1>>

It is possible to judge whether error correction is possible by the ECC circuit, with using typically the BIST circuit, if the semiconductor device of the embodiment 1 is used. Thus, unlike the system of the comparative example 1, when there is an error which can be corrected by the ECC circuit, a system failure does not occur. As compared with the system of the comparative example 2, there is no need to diagnose using the software process, thus attaining a reduction in the boot time of the semiconductor device DEV. Further, unlike the system of the comparative example 3, the BIST circuit can be used also in the production test, and the test can be performed using the physical address and the physical data, thus appropriately enabling to perform the test reflecting the physical structure of the memory.

Embodiment 2

<<Details of Judgment Circuit (Modification [1])>>

Figure 6:
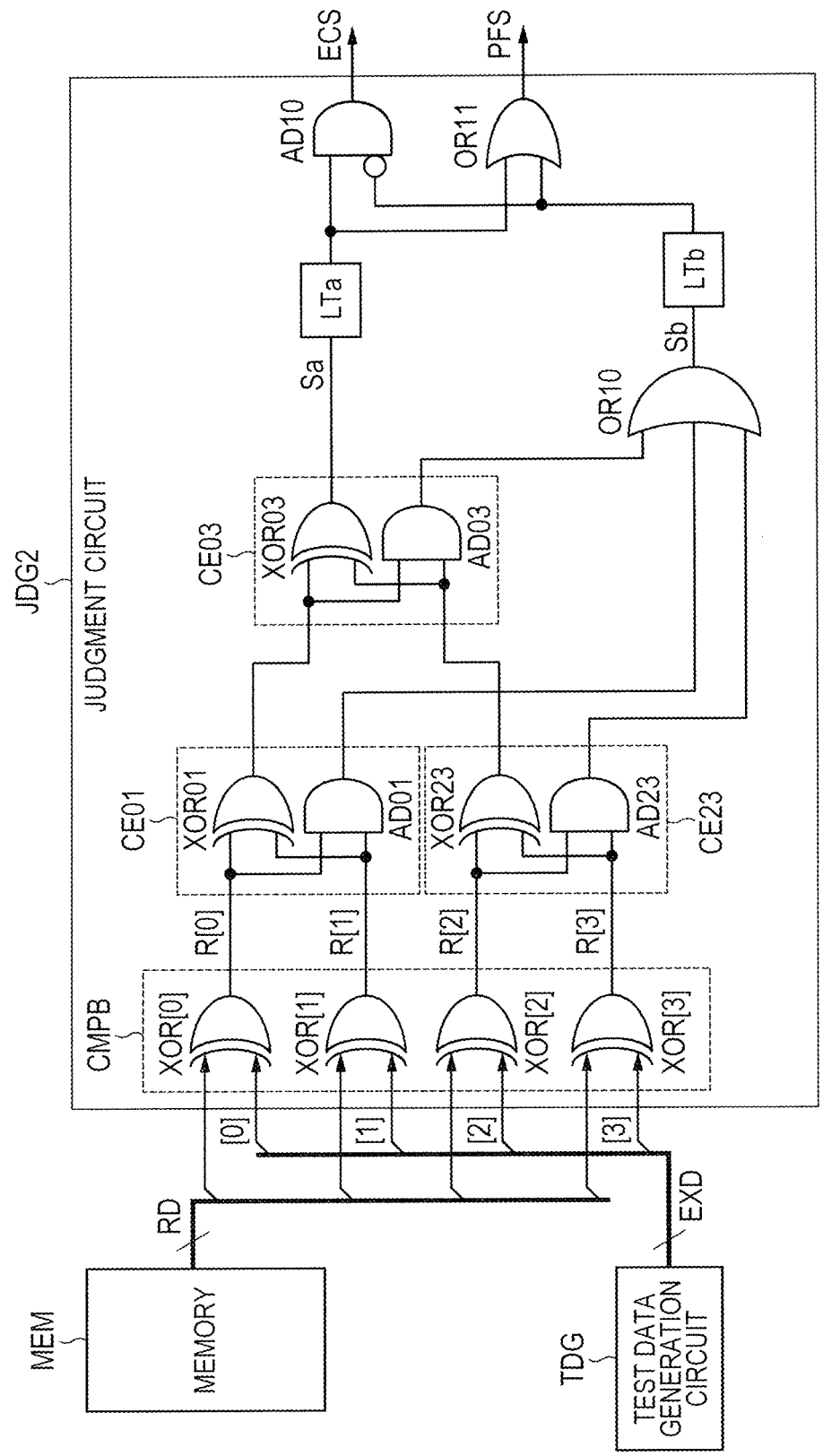
FIG. 6 is a circuitry diagram illustrating a configuration example of the judgment circuit of FIG. 1, in a semiconductor device in an embodiment 2 of the present invention.
Figure 7A:
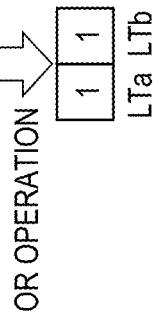
FIG. 7A is a supplementary diagram illustrating a function of the main signal in the judgment circuit of FIG. 6, and FIG. 7B and FIG. 7C are pattern diagrams illustrating an operation example at the time of a test using the judgment circuit of FIG. 6.
Figure 7B:
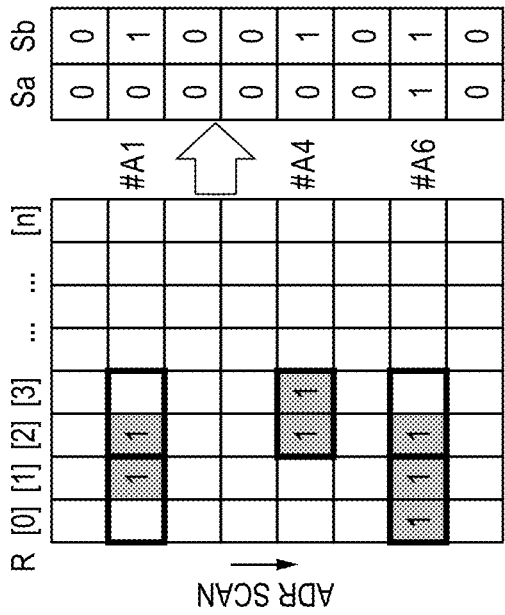
Figure 7C:
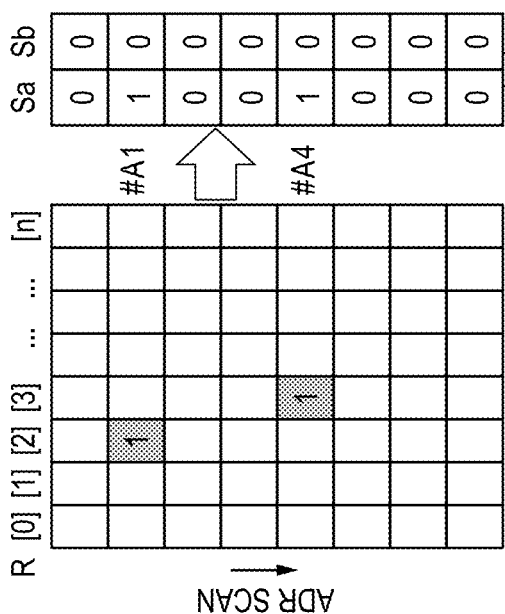

FIG. 6 is a circuitry diagram illustrating a configuration example of the judgment circuit of FIG. 1, in a semiconductor device according to an embodiment 2 of the present invention. FIG. 7A is a supplementary diagram illustrating a function of the main signal in the judgment circuit of FIG. 6, and FIG. 7B and FIG. 7C are pattern diagrams illustrating an operation example at the time of a test using the judgment circuit of FIG. 6. In FIG. 6, the read data RE and the expected value data EXD both include "n" bits ("n" is an integer equal to or greater than 2). In this specification, for the sake of simple descriptions, n=4.

The judgment circuit JDG2 illustrated in FIG. 6 includes a plurality of exclusive OR gates XOR[0] to XOR[3], XOR01, XOR23, XOR03, a plurality of AND gates AD01, AD23, AD03, and an OR gate OR10. In addition, the judgment circuit JDG2 includes latch circuits LTa, LTb, an AND gate AD10, and an OR gate OR11. Each of the exclusive OR gate XOR[0] to XOR[3], XOR01, XOR23, XOR03 outputs "0" level or "1" level in accordance with matching/non-matching of logic levels of two inputs. Each of the AND gates AD01, AD23, AD03 outputs the "1" level, when the logic levels of the two inputs are both at the level "1". The OR gate OR10 judges whether at least one of the AND gates AD01, AD23, and AD03 has output the level "1".

In this case, the exclusive OR gates XOR[0] to XOR[3], XOR01, XOR23, and XOR03 are coupled sequentially in a tournament tree form, in a manner that one final-stage output is provided while providing the "n" bit read data RD and the "n" bit expected value data EXD corresponding to each address ADR as first-stage inputs. In this example, four exclusive OR gates (XOR[0] to XOR[3]) are provided in the first stage of the tournament tree form, two (XOR01, XOR23) of them are provided in the second stage, and one (XOR03) of them is provided in the third stage.

The AND gates AD01, AD23, and AD03 are provided to have the same inputs as the exclusive OR gates provided from the second stage to the final stage, in a form corresponding respectively to the exclusive OR gates provided in the second stage to the final stage of the tournament tree form. In this example, two AND gates AD01 and AD23 are provided to have the same inputs as the two exclusive OR gates XOR01 and XOR23 provided in the second stage, and one AND gate AD03 is provided to have the same input as the one exclusive OR gate XOR03 provided in the third stage.

Like the case of FIG. 3A, the exclusive OR gates XOR[0] to XOR[3] in the first stage are included in the bit comparison circuit CMPB, and receive the read data RD and the expected value data EXD input therefrom, in association with each address ADR. The exclusive OR gate XOR01 and the AND gate AD01 are included in an element circuit CE01, the exclusive OR gate XOR23 and the AND gate AD23 are included in an element circuit CE23, and the exclusive OR gate XOR03 and the AND gate AD03 are included in an element circuit CE03.

A signal Sa from the final stage (XOR03) of the exclusive OR gates coupled in a tournament tree form is an input signal of the latch circuit LTa. A signal Sb from the OR gate OR10 is an input signal of the latch circuit LTb. Each of the latch circuits LTa and LTb has the configuration as illustrated in, for example, FIG. 3B. However, each of the latch circuits LTa and LTb does not need to include a scanning function, and does not need to include the selection circuit SEL.

The AND gate AD10 outputs a correction judgment signal ECS at the level "1" (correction is possible), when output signals of the latch circuits LTa and the latch circuit LTb are respectively at the level "1" and the level "0". The OR gate OR11 outputs a pass/fail judgment signal PFS at the level "0" (pass), when the output signals of the latch circuits LTa and the latch circuit LTb are at the level "0".

In this configuration, the signal Sa from the exclusive OR gate XOR03 in the final stage is at the level "0", if the number of the bits at the level "1" (that is, non-matching bits) in the comparison result signals R[0] to R[3] from the exclusive OR gates XOR[0] to XOR[3] in the first stage is an even number (including 0), while the signal Sa is at the level "1", if the number thereof is an odd number. At any of the addresses ADR, at the occurrence of an odd number of errors (that is, non-matching bits) even at once, the level "1" is held by the latch circuit LTa. However, in this tree of the exclusive OR gates, it is not possible to discriminate whether the number of error is 1 (bit) or whether the number is an odd number equal to or greater than 3 bits. In addition, it is not possible to detect an even number of errors equal to or greater than 2 bits.

The signal Sb from the OR gate OR10 is at the level "1", when at least one of the AND gates AD01, AD23, and AD03 outputs the level "1". At any address ADR, if the level "1" is output even at once from the OR gate OR10, the level "1" is held by the latch circuit LTb. In this case, each of the AND gates AD01, AD23, and AD03 outputs the level "1", at the occurrence of errors equal to or greater than 2 bits at any address ADR.

For example, when the comparison result signals (R[0], R[1])=(1, 1), the AND gate AD01 outputs the level "1". When the comparison result signals (R[2], R[3])=(1, 1), the AND gate AD23 outputs the level "1". When any 1 bit of the comparison result signals R[0], R[1] is at the level "1", and any 1 bit of the comparison result signals R[2], R[3] is at the level "1", the AND gate AD03 outputs the level "1". At the occurrence of errors of 3 bits or 4 bits, at least one of the AND gates AD01, AD23, and AD03 outputs the level "1".

By combining outputs of the latch circuits LTa and LTb, it is possible to generate the final test result. Particularly, when the output of the latch circuit LTa is at the level "1" and the output of the latch circuit LTb is at the level "0" (when an odd number of error(s) has(have) occurred, and the error is not equal to or greater than 2 bits), it can be said that a 1-bit error has occurred. Thus, this is a "correction possible case". When the output of the latch circuit LTb is at the level "1" (that is, when errors of equal to or greater than 2 bits have occurred) regardless of the output of the latch circuit LTa, it is possible to judge that correction is not possible. Further, when the outputs of the latch circuit LTa and LTb are both at the level "0" (that is, "pass", or when an odd number of "pass"(es) has occurred, and when this error is not equal to or greater than 2), it implies that there is no occurrence of error. Thus, is it possible to judge that this is a "pass" case.

FIG. 7A illustrates functions of signals Sa and Sb. When signals (Sa, Sb)=(0, 0), it is a "pass case". When signals (Sa, Sb)=(1, 0), it is "fail" and a correction possible case. When the signals (Sa, Sb)=(x, 1) (x is "don't care"), it is "fail" and a correction impossible case. As a specific example of a test, in FIG. 7B, the comparison result signal R[2] is at the level "1" (non-matching level) in a read cycle for an address ADR # A1, and the comparison result signal R[3] is at the level "1" in a read cycle for the address ADR # A4. In this case, at the addresses ADR # A1 and # A4, the signals (Sa, Sb)=(1, 0), the output of the latch circuit LTa is at the level "1", and the output of the latch circuit LTb is at the level "0". As a result, the pass/fail judgment signal PFS and the correction judgment signal ECS are both at the level "1". This represents "fail" and that it is a correction possible case.

In FIG. 7C, the comparison result signals R[1] and R[2] are at the level "1" in the read cycle for the address ADR # A1, while the comparison result signals R[2] and R[3] are at the level "1" in the read cycle for the address ADR # A4. At the address ADR # A1, the signal Sb is at the level "1", because the AND gate AD03 outputs the level "1", and the signal Sa is at the level "0", because the number of errors is an odd number. At the address ADR # A4, the signal Sb is at the level "1", because the AND gate AD23 outputs the level "1", and the signal Sa is at the level "0", because the number of errors is an even number.

Further, in FIG. 7C, the comparison result signals R[1], R[2], and R[3] are at the level "1" in a read cycle for the address ADR # A6. At the address ADR # A6, the signal Sb is at the level "1", because the AND gate AD01 outputs the level "1", and the signal Sa is at the level "1", because the number of errors is an odd number. In this manner, when the number of errors is equal to or greater than 3 bits, either one of the AND gates AD01, AD23, and AD03 detects 2-bit errors included therein. Thus, the signal Sb is at the level "1". As a result of this test, the latch circuits LTa and LTb are both at the level "1". Therefore, the pass/fail judgment signal PFS is at the level "1", and the correction judgment signal ECS is at the level "0". This represents "fail" and that it is a correction impossible case.

Figure 8:
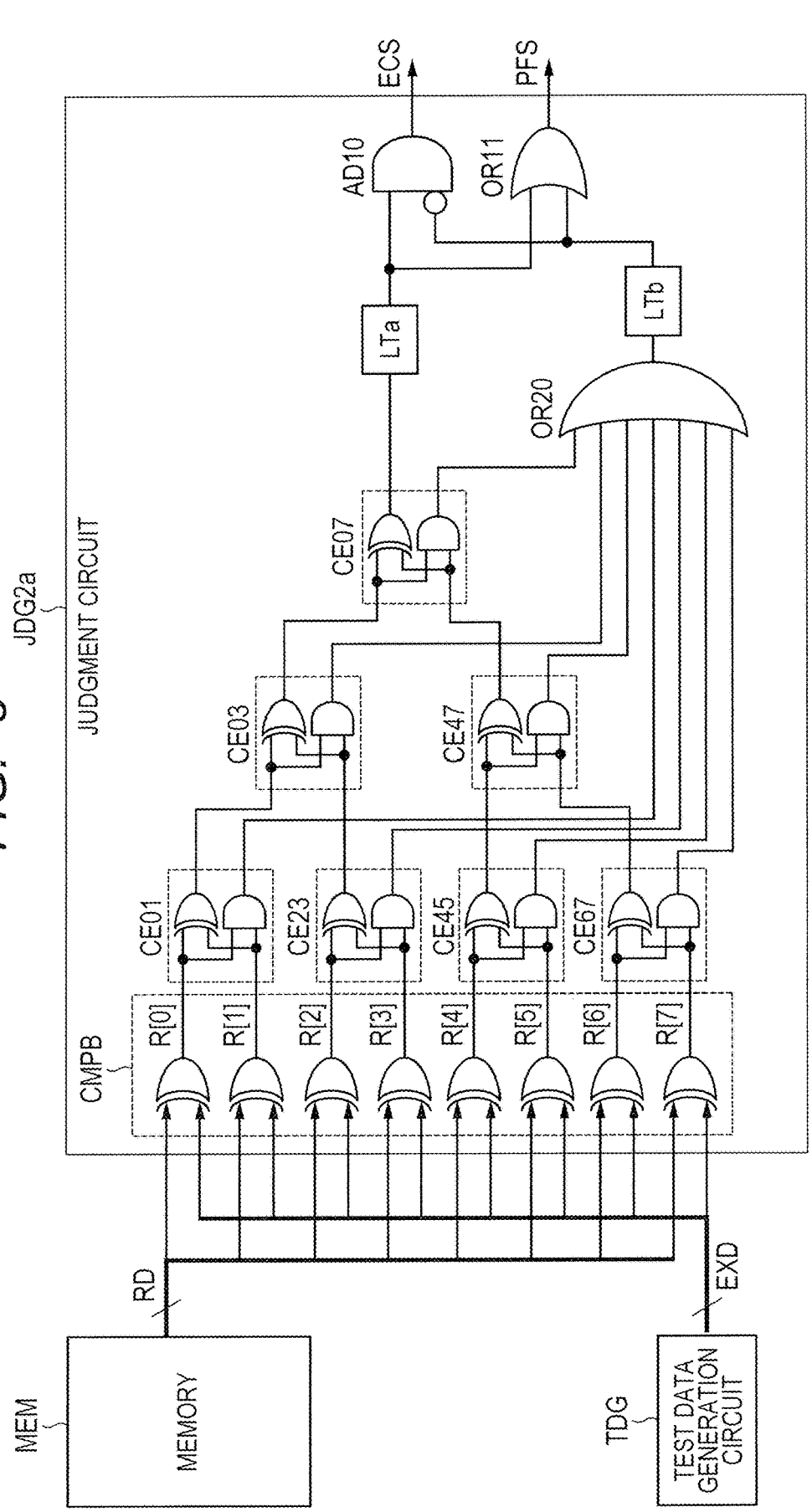
FIG. 8 is a circuitry diagram illustrating a configuration example in which the judgment circuit of FIG. 6 is expanded.

FIG. 8 is a circuitry diagram illustrating a configuration example in which the judgment circuit of FIG. 6 is expanded. Unlike the judgment circuit JDG2 of FIG. 6, in a judgment circuit JDG2a illustrated in FIG. 8, the read data RD and the expected value data EXD include 8 bits (n=8). In this case also, like the case of FIG. 6, the exclusive OR gates are coupled in a tournament tree form, AND gates are provided to have the same inputs as the exclusive OR gates coupled from the second stage to the final stage, and outputs of the AND gates may simply be input to an OR gate OR20. As a result, in FIG. 8, in addition to the configuration of FIG. 6, four element circuits CE45, CE67, CE47, and CE07 which are configured with the exclusive OR gates and the AND gates are provided.

In this example, "n" is $2^N$. However, "n" is not limited to $2^N$, and may be an integer equal to or greater than 2. In this example, like a seeded case in a general tournament tree, the seeded exclusive OR gate is appropriately inserted in any of the second stage to the final stage, and an AND gate may be provided therewith. For example, in FIG. 8, when n=9, an element circuit may be inserted between the element circuit CE67 and the element circuit CE47, and two inputs of the element circuit may be as an output signal of the exclusive OR gate of the element circuit CE67 and an added comparative result signal (that is, R[8] (not illustrated)). Not limited to this, it is possible to insert an element circuit between the element circuit CE47 and the element circuit CE07, and it is also possible to insert an element circuit in a latter stage of the element circuit CE07.

<<Main Effect of Embodiment 2>>

As described above, using the semiconductor device of the embodiment 2, it is possible to obtain the same effect as that of the embodiment 1. Further, it is possible to correctly judge an error which can not be judged by the system of the embodiment 1. That is, when the judgment circuit JDG1 of FIG. 3A is used, as illustrated in, for example, FIG. 7B, in a situation where a 1-bit error occurs in a plurality of different positions, the count value of the counter circuit CUNT1 is "2". Thus, it is judged undesirably as a correction impossible case. In this case, it narrows a judgment range in which correction is possible, though there is no problem from a fail-safe point of view. Using the judgment circuit JDG2 of FIG. 6, it is possible to correctly judge the correction possible case, though the circuit configuration is more complicated than the configuration example of FIG. 3A.

Embodiment 3

<<Details of Judgment Circuit (Modification Example [2])>>

Figure 9:
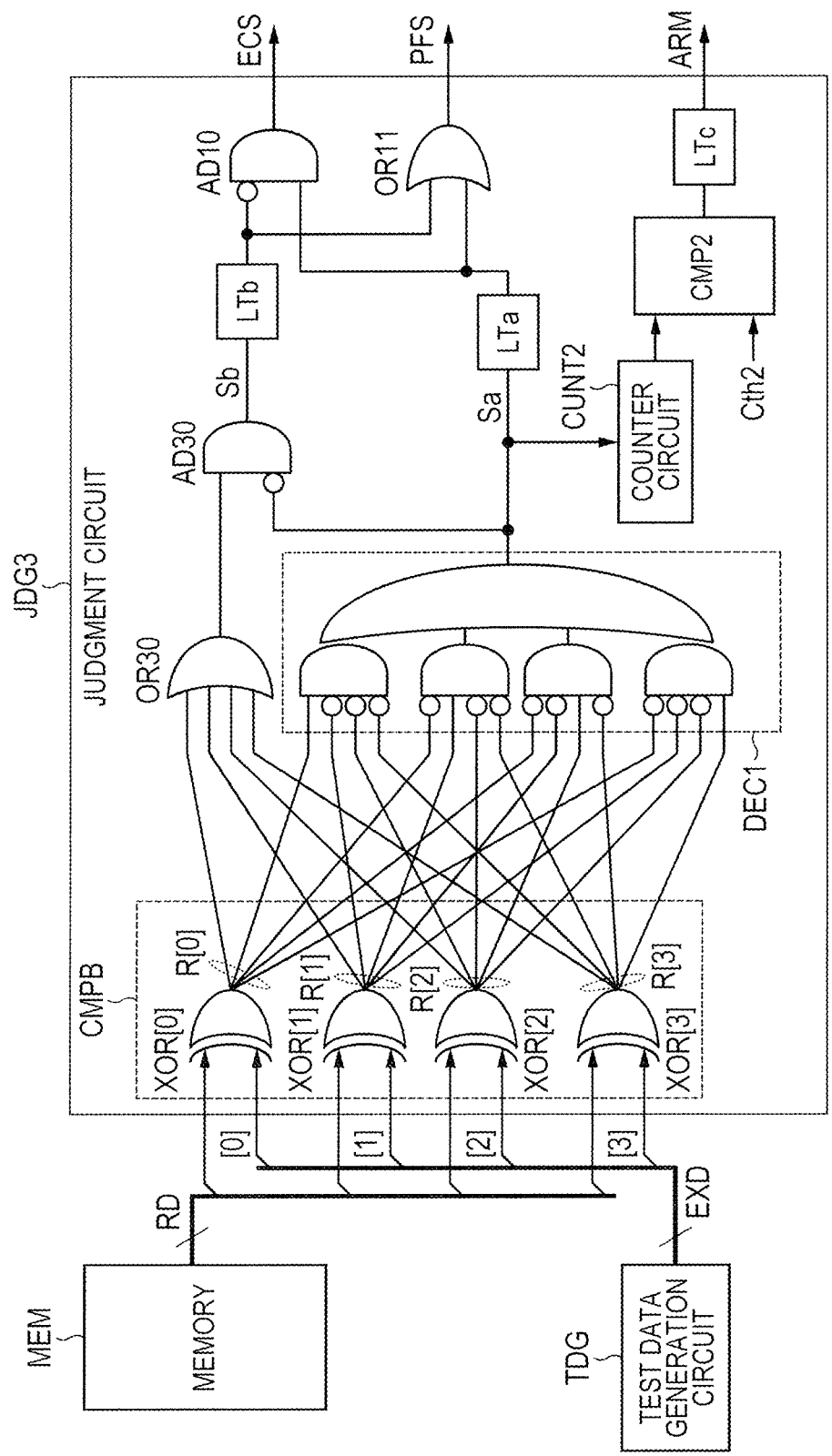
FIG. 9 is a circuitry diagram illustrating a configuration example of the judgment circuit of FIG. 1, in a semiconductor device according to an embodiment 3 of the present invention.
Figure 10:
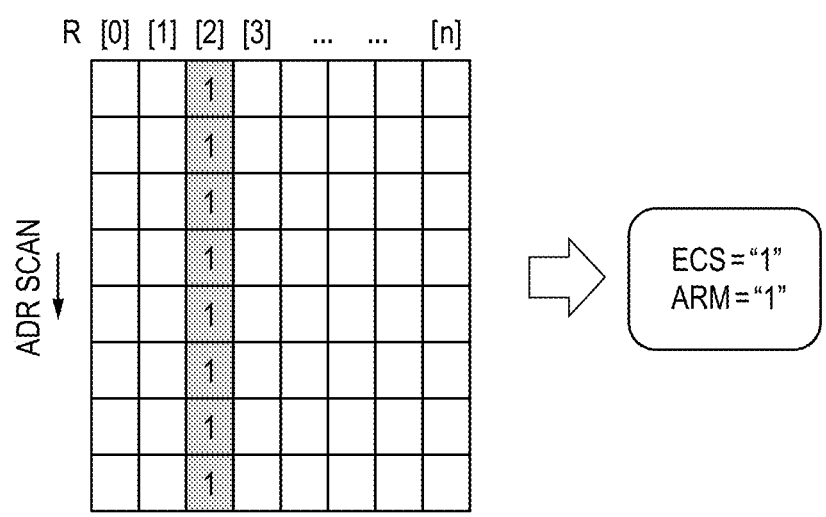
FIG. 10 is a pattern diagram illustrating an operation example at the time of a test using the judgment circuit of FIG. 9.

FIG. 9 is a circuitry diagram illustrating a configuration example of the judgment circuit of FIG. 1, in a semiconductor device according to an embodiment 3 of the present invention. FIG. 10 is a pattern diagram illustrating an operation example at the time of a test using the judgment circuit of FIG. 9. In FIG. 9, the read data RD and the expected value data EXD both include "n" bits (in this case, 4 bits, for the sake of simple descriptions).

A judgment circuit JDG3 illustrated in FIG. 9 includes a bit comparison circuit CMPB, an OR gate OR30, a 1-bit error decode circuit DEC1, an AND gate AD30, latch circuits LTa and LTb, and an AND gate AD10, and an OR gate OR11. Like the case of FIG. 3A, the bit comparison circuit CMPB outputs four bit comparison result signals R[0] to R[3] in which each bit is at the level "0" or "1" in accordance with matching/non-matching of each corresponding bit. The latch circuits LTa and LTb, the AND gate AD10, and the OR gate OR11 are the same as those of FIG. 6.

The OR gate OR30 judges whether at least one bit of the four bit comparison result signals R[0] to R[3] is at the level "1". The 1-bit error decode circuit DEC1 is configured with an AND-OR complex gate, judges whether only one bit of four bit comparison result signals R[0] to R[3] is at the level "1", and outputs a signal Sa at the level "1" when only one bit is at the level "1". Specifically, the 1-bit error decode circuit DEC1 has four AND gates. The AND gates respectively detect different one bits at the level "1". Then, the circuit collects and outputs the detection results, using the OR gate. As a result, the 1-bit error decode circuit DEC1 outputs the signal Sa at the level "1", when the 1 bit error has been detected.

The AND gate AD30 outputs a signal Sb at the level "1", when the output of the OR gate OR30 is at the level "1", and when the output of the 1-bit error decode circuit DEC1 is at the level "0" (that is, at the occurrence of an error, this error is not a 1-bit error). This signal Sb at the level "1" represents the occurrence of errors equal to or greater than 2 bits, like the case of FIG. 6.

The signal Sa of FIG. 9 is a little different from the signal Sa of FIG. 6 in their functions. That is, when the signal Sa of FIG. 6 is at the level "1", at the occurrence of an odd number of error(s). However, the signal Sa of FIG. 9 is at the level "1", only at the occurrence of 1 bit error, in the odd number of error(s). Note that it is possible to discriminate between 1 bit error and 2 bit errors based on the signal Sb. Thus, like the case of FIG. 9, it is substantially possible to handle the level "1" of the signal Sa of FIG. 6 as a 1 bit error. Using these signals Sa and Sb, the judgment circuit JDG3 of FIG. 9 can perform the same judgment operation as that of the judgment circuit JDG2 of FIG. 6.

The judgment circuit JDG3 of FIG. 9 includes further, a counter circuit CUNT2, a count value comparison circuit CMP2, and a latch circuit LTc. The counter circuit CUNT2 counts the number of times the correction possible case has occurred at the target address ADR to be tested. Particularly, the counter circuit CUNT2 counts the number of times the 1-bit error decode circuit DEC1 outputs the level "1". The count value comparison circuit CMP2 outputs the level "1", when the count value of the counter circuit CUNT2 exceeds a predetermined threshold value Cth2. The latch circuit LTc includes the same configuration as that of FIG. 3B, latches the corresponding level "1", and outputs it as an alarm signal ARM at the level "1".

In the system of the above-described embodiment 2, for example, even in a situation of an IC error (that is, in a situation where a particular 1 bit has a static error.), it is judged as a correction possible case, unless any other error occurs. This judgment is correction, however, in fact, a processing load is applied to the ECC circuit by correction of the corresponding IC error. Thus, substantially, the error correction performance by the ECC circuit is remarkably deteriorated or ineffective. As a result, error correction cannot be performed, when a soft error has occurred during a normal operation after booting.

For example, as illustrated in FIG. 10, when an IC error has occurred as a 1 bit error, an alarm signal ARM at the level "1" is output, together with a correction judgment signal ECS at the level "1" representing the correction possible case. In the configuration example of FIG. 9, when the number of times the 1 bit error (including the IC error) has occurred exceeds the threshold value Cth2, the alarm signal ARM at the level "1" is output. For the threshold value Cth2, for example, the threshold value Cth2 is stored in a non-volatile memory of the semiconductor device DEV, thereby enabling to set it arbitrarily from externals.

By excluding the counter circuit CUNT2 from the judgment circuit JDG3 of FIG. 9, it can be used instead of the judgment circuit JDG2 of FIG. 6. The counter circuit CUNT2 as the same as the judgment circuit JDG3 of FIG. 9 is added to the judgment circuit JDG2 of FIG. 6, thereby enabling to use it instead of the judgment circuit JDG3 of FIG. 9. In the latter case, for equivalence of the circuits of FIG. 6 and FIG. 9, the counter circuit CUNT2 may count the number of times the signals (Sa, Sb)=(1, 0) have been generated (that is, the number of times the 1 bit error has occurred), and may substantially count the number of times the signal Sa is at the level "1". That is, when the final test result shows the correction possible case, while counting the number of times the signal Sa is at the level "1", the count value represents the number of times the 1 bit error has been generated.

<<Main Effect of Embodiment 3>>

As described above, the same effect as the embodiment 2 can be obtained by using the semiconductor device of the embodiment 3. Further, detection as to whether the error correction performance by the ECC circuit is remarkably deteriorated or ineffective is performed, and this detection is informed to the system control circuit SYSCT using the alarm signal ARM. When this alarm signal ARM is received, the system control circuit SYSCT may perform, for example, the same process as that of Step S108 of FIG. 5. In FIG. 9, for example, when the number of bits to be error-corrected by the ECC circuit is two, a 2-bit error decode circuit as the same as the 1-bit error decode circuit may be added.

Embodiment 4

<<Schematic Configuration of Semiconductor Device (Application Example)>>

Figure 11:
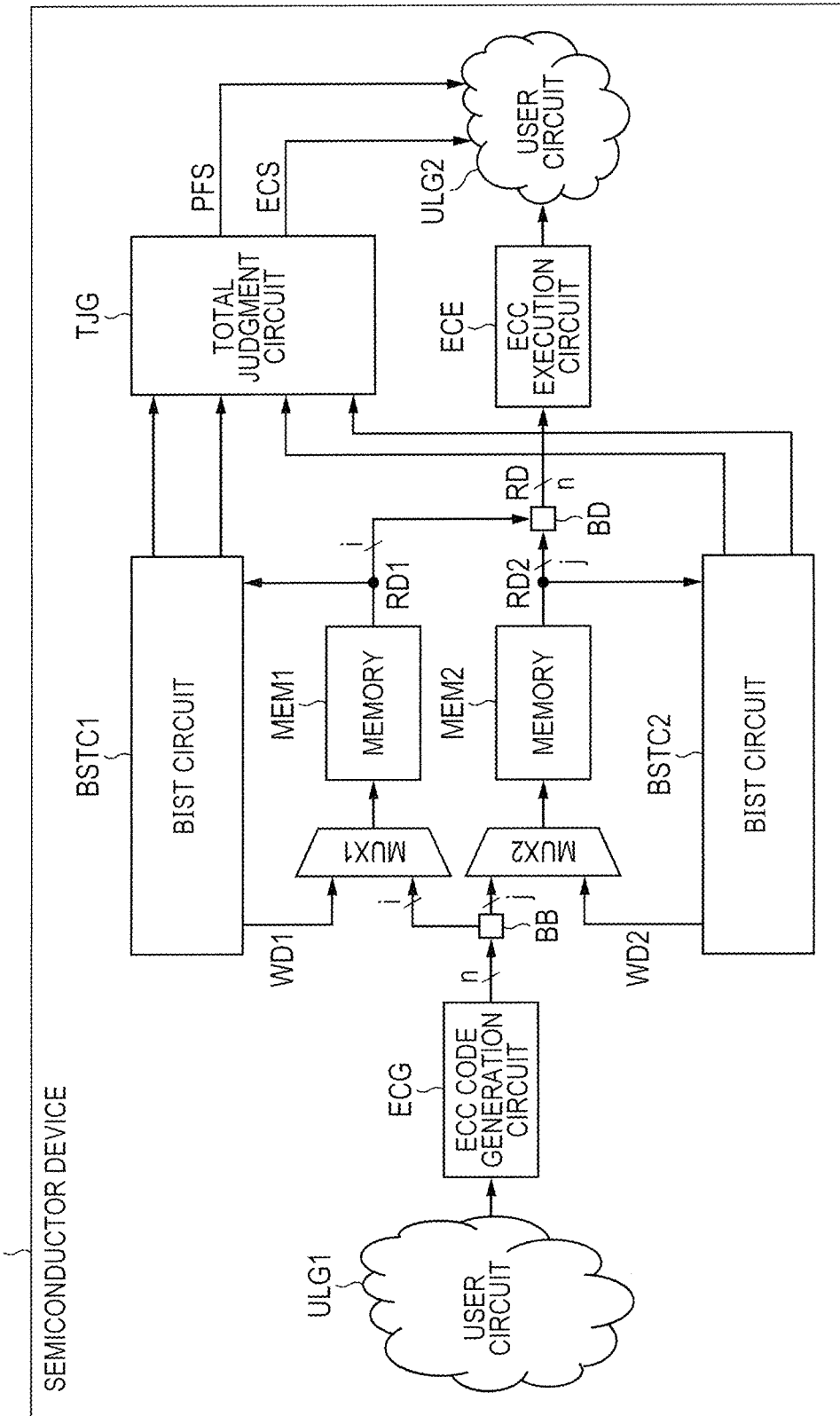
FIG. 11 is a schematic diagram illustrating a configuration example of the main part of a semiconductor device according to an embodiment 4 of the present invention.
Figure 12:
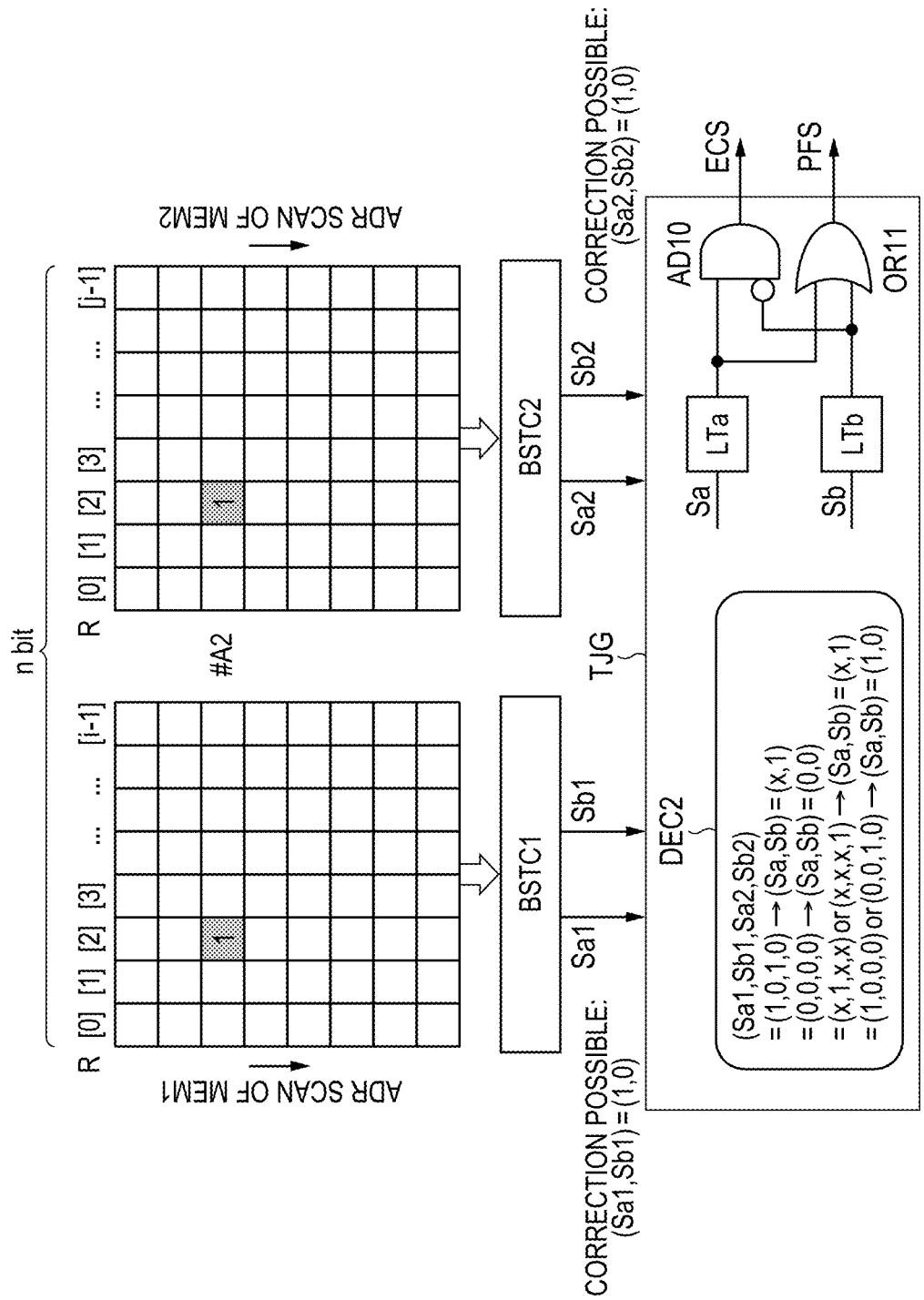
FIG. 12 is a pattern diagram illustrating an operation example at the time of a test in the semiconductor device of FIG. 11.

FIG. 11 is a schematic diagram illustrating a configuration example of the main part of a semiconductor device according to an embodiment 4 of the present invention. FIG. 12 is a pattern diagram illustrating an operation example at the time of a test in the semiconductor device of FIG. 11. The semiconductor device DEV illustrated in FIG. 11 includes a plurality of memories MEM1 and MEM2, a plurality of BIST circuits BSTC1 and BSTC2, a plurality of selection circuits MUX1 and MUX2, an ECC circuit (ECG, ECE), a user circuit ULG, and a total judgment circuit TJG.

The user circuit ULG accesses the memories MEM1 and MEM2, using logical addresses and "n" bit logical data (write data) corresponding to each logical address, through the ECC circuits (ECG, ECE). The memory MEM1 holds a part of bits ("i" bits) of the "n" bit logical data corresponding to the logical address. The memory MEM2 holds another part of bits ("j" bits) of the "n" bit logical data corresponding to the logical address.

The BIST circuits BSTC1 and BSTC2 test the memories MEM1 and MEM2 respectively through the selection circuits MUX1 and MUX2, like the case of FIG. 1 and FIG. 3. Input to the selection circuit MUX1 include "i" bit write data WD1 from the BIST circuit BSTC1 and "i" bit write data from a bit division circuit BB. Input to the selection circuit MUX2 include "j" bit write data WD2 from the BIST circuit BSTC2 and "j" bit write data from the bit division circuit BB. The bit division circuit BB divides the "n" bit write data from the ECC code generation circuit ECG into "i" bits and "j" bits. "i" bit read data RD1 from the memory MEM1 and "j" bit read data RD2 from the memory MEM2 are integrated into "n" bit read data RD by a bit integration circuit BD, and output to the ECC execution circuit ECE.

Accordingly, when the memory space of the system is configured in combination of the memories MEM1 and MEM2, the BIST circuits BSTC1 and BSTC2 are provided individually for the memories MEM1 and MEM2, and the ECC circuit may operate while assuming the memories MEM1 and MEM2 as one unit. In this case, a problem occurs, when the BIST circuit BSTC1 detects a 1-bit error at a physical address corresponding to a predetermined logical address in the MEM1, or when the BIST circuit BSTC2 detects a 1-bit error at a physical address corresponding to the same predetermined logical address in the MEM2. That is, in this case, 2-bit errors are generated as seen from the ECC circuit, and thus it is a correction impossible case.

The total judgment circuit TJG judges that the final test result shows a correction impossible case, when the judgment circuit (for example, JDG2 of FIG. 6) in the BIST circuit BSTC1 and the judgment circuit (for example, JDG2) in the BIST circuit BSTC2 both judge that it is a correction possible case at the same logical address. Particularly, it is assumed that, for example, two memories MEM1 and MEM2 having the same configuration are used for simply doubly expanding the data width. In this case, as illustrated in FIG. 12, the BIST circuits BSTC1 and BSTC2 are booted at the same time to execute the test, and signals Sa1 and Sb1 from the BIST circuit BSTC1 and signals Sa2 and Sb2 of the BIST circuit BSTC2 are input to the total judgment circuit TJG.

The signals Sa1 and Sb1 and the signals Sa2 and Sb2 correspond, for example, to the signals Sa and Sb of FIG. 6. When the signals (Sa1, Sb1, Sa2, Sb2)=(1, 0, 1, 0) at the address ADR #2 (that is, when it is individually judged that it is a correction possible case), the total judgment circuit TJG judges that it is a correction impossible case, and generates signals (Sa, Sb)=(x, 1) representing a correction impossible case, as the total final test result. The signals Sa and Sb are converted into a correction judgment signal ECS and a pass/fail judgment signal PFS, like the case of FIG. 6. The total judgment circuit TJG generates signals Sa and Sb in accordance with any other combinations, for any other combinations of the signals (Sa1, Sb1, Sa2, Sb2).

This simple case has been assumed, however, in fact, other cases may possibly occur. The other cases include a case in which a logical address seen from the user circuit ULG and a physical address seen from the BIST circuits BSTC1 and BSTC2 are appropriately scrambled and a case in which the BIST circuits BSTC1 and BSTC2 cannot be booted at the same time. In this case, for example, the BIST circuits BSTC1 and BSTC2 may hold the physical addresses corresponding to the detected 1-bit error, and the total judgment circuit TJG may judge whether the held physical addresses are the same logical address, based on the corresponding relationship of the preset logical addresses and the physical addresses. When the number of bits to be error-corrected is two, the BIST circuits BSTC1 and BSTC2 may hold information representing whether it is a 1-bit error or 2-bit errors. The total judgment circuit TJG may judge whether it is a correction possible case, with the information about the number of bits.

<<Main Effect of Embodiment 4>>

Accordingly, it is possible to obtain the same effect as the embodiments 1 to 3, using the semiconductor device of the embodiment 4. Further, it is possible to appropriately judge whether error correction is possible or not by the ECC circuit, for a system, in which the BIST circuit is provided for each of the memories, and in which the ECC circuit is commonly provided for the memories.

The invention by the present inventors have specifically been described based on the preferred embodiments. The present invention is not limited to the preferred embodiments, and various changes may be made without departing from the scope thereof. For example, above-described embodiments have specifically been described for easy description of the present invention, and are not to limit to any of those including the entire above-described configuration. A part of the configuration of one embodiment may possibly be replaced by the configuration of another embodiment, and the configuration of one embodiment may be added to the configuration of another embodiment. A part of the configuration of each embodiment may be added to, deleted from, or replaced by the configuration of another embodiment.

What is claimed is:

1. A semiconductor device comprising:
a memory; and
a BIST (Built In Self Test) circuit which diagnoses the memory,
wherein the BIST circuit includes
an address generation circuit which generates a target address to be tested in the memory,
a test data generation circuit which generates write data for the address and expected value data for read data from the address, and
a judgment circuit which compares matching/non-matching of the read data and the expected value data for each bit, in association with each address, judges that error correction is possible when a number of non-matching bits is within a range of numbers of bits to be error-corrected by an ECC (Error Correcting Code) circuit, and judges that error correction is not possible when it is not within the range,
wherein the judgment circuit discriminates, for each address, between a first case for judging as "pass" if comparison results of each of the bits coincide with each other, a second case for judging that the error correction is possible, and a third case for judging that the error correction is not possible, outputs a first signal representing that error correction is not possible as a final test result when the third case has occurred at the target address to be tested, and outputs a second signal representing that error correction is possible as the final test result when the third case has not occurred at the target address to be tested and when the second case has occurred,
wherein the semiconductor device further comprises:
a user circuit which includes a function in accordance with a user; and
a system control circuit which performs a boot time control of the semiconductor device, and
wherein after the system control circuit controls the BIST circuit to perform a test after power supply of the semiconductor device, the system control circuit does not boot the user circuit when the first signal is received from the judgment circuit, and the system control circuit boots the user circuit when the second signal is received.

2. The semiconductor device according to claim 1, wherein the judgment circuit has a first counter circuit which counts a number of times the second case has occurred at the target address to be tested.

3. The semiconductor device according to claim 1, further comprising:
an ECC code generation circuit which generates write data having an ECC code affixed thereto at a time of a write operation of the memory;
an ECC execution circuit which executes error correction, based on the ECC code at a time of a read operation of the memory, and
a selection circuit which selects either one of the write data from the ECC code generation circuit and the write data from the BIST circuit, and outputs it to the memory.

4. The semiconductor device according to claim 1, wherein the judgment circuit has
a bit comparison circuit compares matching/non-matching of the read data with "n" bits and the expected value data with "n" bits, and outputs a comparison result signal with "n" bits in which each bit is at a first logical level or a second logical level in accordance with the matching/non-matching of each of the bits,
a latch circuit with "n" bits which latches the comparison result signal respectively with the "n" bits,
a second counter circuit which counts a number of bits in which the second logical level is latched from the "n" bit latch circuit, at a time the test is ended, and
a count value comparison circuit which compares a count value of the second counter circuit and a preset threshold value, thereby judging whether a number of non-matching bits is within a range of numbers of bits to be error-corrected by the ECC circuit.

5. The semiconductor device according to claim 1, wherein the judgment circuit includes a plurality of first logical gates which output a first logical level or a second logical level, in accordance with matching/non-matching of logical levels of two inputs, a plurality of second logical gates which output a predetermined logical level, when the logical levels of the two inputs are both the second logical level, and a third logical gate which judges whether at least one of the second logical gates outputs the predetermined logical level, wherein the first logical gates are coupled in a tournament tree form sequentially in a form that there is one output in a final stage, while providing the "n" bit read data and the "n" bit expected value data corresponding to each address as first-stage inputs, and wherein the second logical gates are provided to have same inputs as the first logical gates provided from a second stage to the final stage, in a form corresponding respectively to the first logical gates provided from the second stage to the final stage of the tournament tree form.

6. The semiconductor device according to claim 5, wherein the judgment circuit further has a first counter circuit which counts a number of times an output of the first logical gates in the final stage is at the second logical level at the target address to be tested.

7. The semiconductor device according to claim 1, wherein the judgment circuit has a bit comparison circuit which compares matching/non-matching of the "n" bit read data and the "n" bit expected value data for each address, and outputs an "n" bit comparison result signal in which each bit is at a first logical level or a second logical level in accordance with the matching/non-matching of each corresponding bit, a fourth logical gate which judges whether at least one bit of the "n" bit comparison result signal is at the second logical level, and a 1-bit error decode circuit which judges whether only 1 bit in the "n" bit comparison result signal is at the second logical level, and outputs a predetermined logical level when only 1 bit is at the second logical level.

8. The semiconductor device according to claim 7, wherein the judgment circuit further includes a first counter circuit which counts a number of times the 1 bit error decode circuit outputs the predetermined logical level at the target address to be tested.

9. A diagnostic method for a semiconductor device having a memory, comprising:

a first step of generating a target address to be tested in the memory;

a second step of generating write data for the address and expected value data for read data from the address, and a third step of comparing matching/non-matching of the read data and the expected value data for each address, judging that error correction is possible when a number of non-matching bits is within a range of numbers of bits to be error-corrected by an ECC (Error Correcting Code) circuit, and judging that error correction is not possible when the number is not within the range, wherein the third step includes a third A step of discriminating, for each address, between a first case of judging as "pass" if comparison results all coincide with each other corresponding to each bit, a second case of judging that the error correction is possible, and a third case of judging that the error correction is not possible, and a third B step of outputting a first signal representing that error correction is not possible as a final test result, when the third case has occurred at the target address to be tested, and outputting a second signal representing that error correction is possible as the final test result, when the third case has not occurred at the target address to be tested and the second case has occurred, wherein the first step, the second step, and the third step are executed by a BIST (Built In Self Test) circuit included in the semiconductor device, wherein the semiconductor device further includes a user circuit having a function in accordance with a user, and wherein the diagnostic method has a fourth step of controlling the BIST circuit to perform a test after power supply of the semiconductor device, and a fifth step of not booting the user circuit when the first signal is received from the BIST circuit, and booting the user circuit when the second signal is received.

10. The diagnostic method for a semiconductor device, according to claim 9, wherein the third step further includes a third C step of counting a number of times the second case has occurred at the target address to be tested.

* * * * *